United States Patent
Liu et al.

(10) Patent No.: US 12,463,093 B2
(45) Date of Patent: Nov. 4, 2025

(54) METHOD OF TUNING FILM PROPERTIES OF METAL NITRIDE USING PLASMA

(71) Applicant: Applied Materials, Inc., Santa Clara, CA (US)

(72) Inventors: Wenyi Liu, Santa Clara, CA (US); Wei Tang, Santa Clara, CA (US); Srinivas Gandikota, Santa Clara, CA (US); Yixiong Yang, San Jose, CA (US); Yong Wu, Mountain View, CA (US); Jianqiu Guo, San Jose, CA (US); Arkaprava Dan, San Jose, CA (US); Mandyam Sriram, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 18/126,048

(22) Filed: Mar. 24, 2023

(65) Prior Publication Data
US 2023/0245925 A1    Aug. 3, 2023

Related U.S. Application Data

(62) Division of application No. 16/871,400, filed on May 11, 2020, now Pat. No. 11,646,226.

(51) Int. Cl.
*H01L 21/76*    (2006.01)
*H01L 21/285*    (2006.01)
*H01L 21/768*    (2006.01)

(52) U.S. Cl.
CPC .. *H01L 21/76843* (2013.01); *H01L 21/28556* (2013.01); *H01L 21/28568* (2013.01)

(58) Field of Classification Search
CPC . H01L 2224/13111; H01L 2924/00014; H01L 2924/01047; H01L 21/0228; H01L 2224/13099
See application file for complete search history.

(56) References Cited

U.S. PATENT DOCUMENTS 6,391,785 B1    5/2002    Satta et al.
7,410,666 B2    8/2008    Elers et al.
(Continued)

FOREIGN PATENT DOCUMENTS

KR    20110028377 A    3/2011
KR    20190070365 A    6/2019

OTHER PUBLICATIONS

Taiwan Office Action dated Nov. 1, 2024 for Application No. 110115495.
(Continued)

*Primary Examiner* — Tony Tran
(74) *Attorney, Agent, or Firm* — Patterson + Sheridan, LLP

(57) ABSTRACT

A method for forming a metal nitride layer on a substrate includes exposing a substrate having features formed therein to a first deposition gas mixture including metal source material in a processing chamber to deposit metal source material in the features, supplying a first purge gas mixture into the processing chamber to remove excess metal source material and reaction byproducts from the processing chamber, exposing the substrate to a second deposition gas mixture including a nitride source compound in the processing chamber to form no more than one monolayer of metal nitride, supplying a second purge gas mixture into the processing chamber to remove excess nitride source compound and reaction byproducts from the processing chamber, and exposing the substrate to plasma using a microwave plasma source.

7 Claims, 6 Drawing Sheets

(56) References Cited

U.S. PATENT DOCUMENTS

| | | |
|---|---|---|
| 2004/0013803 A1 | 1/2004 | Chung et al. |
| 2014/0087091 A1 | 3/2014 | Lam et al. |
| 2016/0056053 A1 | 2/2016 | Thombare et al. |
| 2016/0343937 A1* | 11/2016 | Jo .................. H10N 70/883 |
| 2018/0308687 A1 | 10/2018 | Smith et al. |

OTHER PUBLICATIONS

Korean Office Action dated Oct. 11, 2024 for Application No. 10-2022-7041777.

* cited by examiner

METHOD OF TUNING FILM PROPERTIES OF METAL NITRIDE USING PLASMA

CROSS-REFERENCE TO RELATED APPLICATIONS

This application is a divisional application of U.S. patent application Ser. No. 16/871,400, filed May 11, 2020, which is incorporated herein by reference.

BACKGROUND

Field

Embodiments of the disclosure generally relate to the field of semiconductor manufacturing processes, more particularly, to methods for depositing metal nitride layers in features of a semiconductor device.

Description of the Related Art

Integrated circuits may include more than one million micro-electronic field effect transistors (e.g., complementary metal-oxide-semiconductor (CMOS) field effect transistors) that are formed on a substrate (e.g., semiconductor wafer) and cooperate to perform various functions within the circuit. Reliably producing sub-half micron and smaller features is one of the key technologies for the next generation of very large scale integration (VLSI), ultra large-scale integration (ULSI) of semiconductor devices, and dynamic random-access memory (DRAM) devices. However, as the limits of integrated circuit technology are pushed, the shrinking dimensions of interconnects in such devices have placed additional demands on processing capabilities.

As feature sizes have become smaller, the demand for higher aspect ratios, defined as the ratio between the depth of the feature and the width of the feature, has steadily increased to 20:1 and even greater. A variety of problems may occur when depositing material layers into features with small geometries, such as geometries having aspect ratios of about 20:1 or more. For example, material layers deposited using a conventional physical vapor deposition (PVD) process or an atomic layer deposition (ALD) process often suffer from high stress, poor step coverage, overhang, and voids formed within the via or trench.

Therefore, there is a need for an improved method for forming material layers in a controlled manner such that film properties can be tuned depending on the use of the material layers in semiconductor devices.

SUMMARY

Implementations of the disclosure generally relate to the field of semiconductor manufacturing processes, more particularly, to methods for depositing a thin film layer in structures of a semiconductor device. In one implementation, a method for forming a metal nitride layer on a substrate is provided. The method includes exposing a substrate to a first deposition gas mixture including metal source material in a processing chamber to deposit metal source material on an exposed surface of the substrate, supplying a first purge gas mixture into the processing chamber to remove excess metal source material and reaction byproducts from the processing chamber, exposing the substrate to a second deposition gas mixture including a nitride source compound in the processing chamber to form no more than one monolayer of metal nitride, supplying a second purge gas mixture into the processing chamber to remove excess nitride source compound and reaction byproducts from the processing chamber, and exposing the substrate to plasma using a microwave plasma source.

In another implementation, a method for forming a metal nitride layer on a substrate is provided. The method includes exposing a substrate to a first deposition gas mixture including metal source material in a processing chamber to deposit metal source material an exposed surface of the substrate, a first purge gas mixture into the processing chamber to remove excess metal source material and reaction byproducts from the processing chamber, exposing the substrate to a plasma reactant including nitrogen radicals in the processing chamber to form no more than one monolayer of metal nitride, and supplying a second purge gas mixture into the processing chamber to remove excess nitride source compound and reaction byproducts from the processing chamber.

In yet another implementation, a method for forming a device structure on a substrate is provided. The method includes forming a thin film layer on a substrate, the thin film layer including metal nitride, and depositing a metal layer on the thin film layer on the substrate. Forming the thin film layer includes tuning film properties of the thin film layer via a plasma treatment process.

BRIEF DESCRIPTION OF THE DRAWINGS

So that the manner in which the above recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
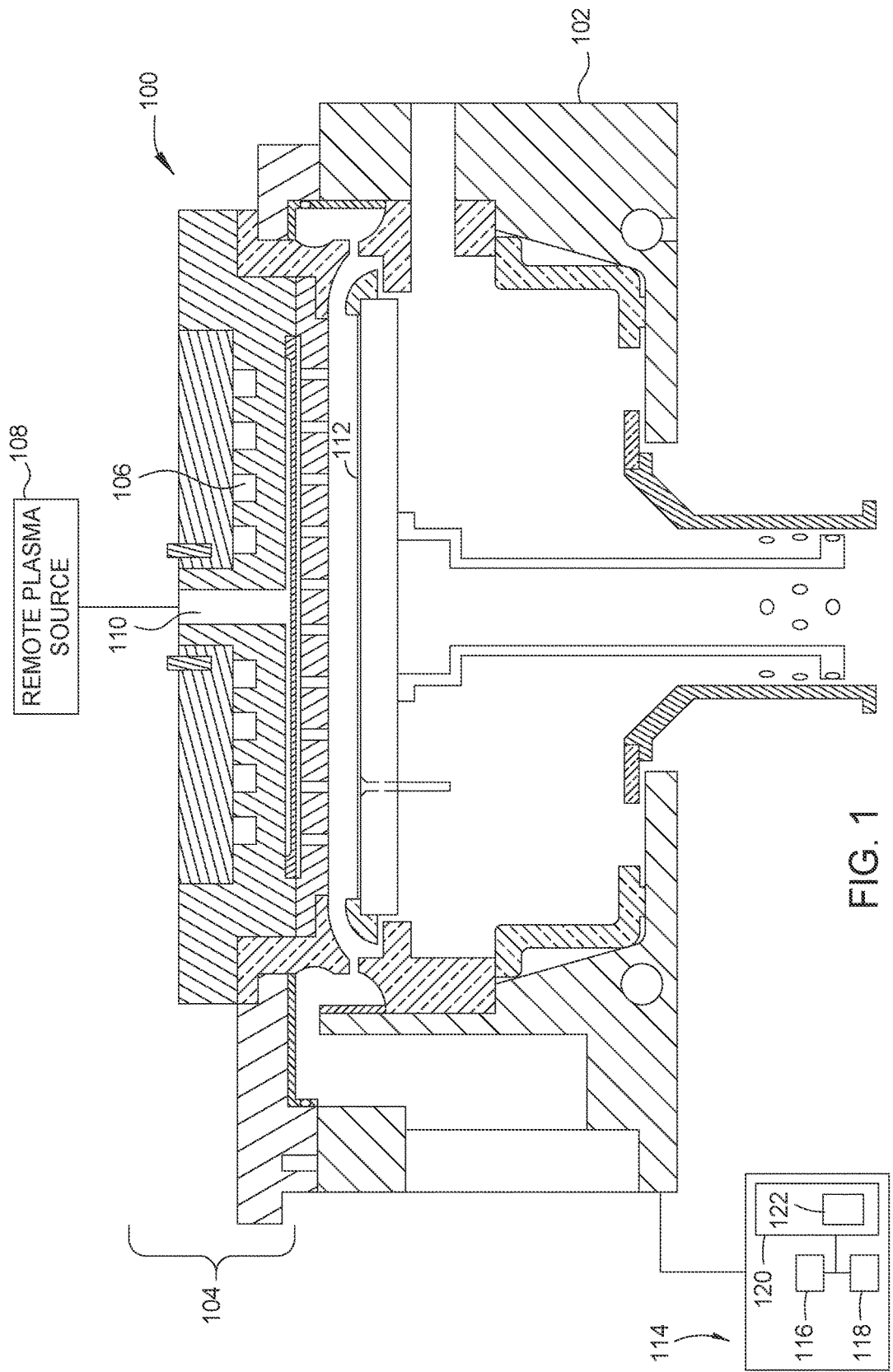
FIG. 1 depicts a schematic view of a processing chamber that may be used for vapor deposition processes according to one embodiment.

To facilitate understanding, identical reference numerals have been used, where possible, to designate identical elements that are common to the figures. It is contemplated that elements and features of one implementation may be beneficially incorporated in other implementations without further recitation. It is to be noted, however, that the appended drawings illustrate only exemplary implementations of this disclosure and are therefore not to be considered limiting of its scope, for the disclosure may admit to other equally effective implementations.

DETAILED DESCRIPTION

In the embodiments described below, methods for forming metal nitride films are provided. In one implementation, the methods include depositing metal nitride films by a non-plasma atomic layer deposition (ALD) process and post-treating as-deposited nitride films using a microwave plasma source. In another implementation, the methods include depositing metal nitride films by a plasma enhanced atomic layer deposition (PE-ALD) process using a remote plasma source. In both implementations, film properties, such as film composition, crystal structure, film density, and resistivity, may be altered by the use of plasma, as compared with similar metal nitride films deposited by a non-plasma ALD process. Furthermore, film properties may be tuned by varying temperatures and pressures within a processing chamber during a plasma treatment, and content ratio of nitrogen, ammonia, and argon in plasma.

As used herein, the term "substrate" refers to a layer of material that serves as a basis for subsequent processing operations and includes a surface to be disposed for forming a metal layer thereon. The substrate may be a material such as crystalline silicon (e.g., Si<100> or Si<111>), silicon oxide, strained silicon, silicon germanium, doped or undoped polysilicon, doped or undoped silicon wafers, patterned or non-patterned wafers silicon on insulator (SOI), carbon doped silicon oxides, silicon nitride, doped silicon, germanium, gallium arsenide, glass, or sapphire. The substrate may comprise dielectric materials such as silicon dioxide ($SiO_2$), or a high-k dielectric material having a dielectric constant greater than 4.0, such as SiON, SiN, hafnium oxide ($HfO_2$), hafnium silicate ($HfSiO_2$), hafnium silicon oxynitride (HfSiON), zirconium oxide ($ZrO_2$), zirconium silicate ($ZrSiO_2$), barium strontium titanate ($BaSrTiO_3$, or BST), lead zirconate titanate ($Pb(ZrTi)O_3$, or PZT), aluminum oxide ($Al_2O_3$) and the like. The substrate can also include one or more nonconductive materials, such as silicon, silicon oxide, doped silicon, germanium, gallium arsenide, glass, and sapphire. The substrate can also include dielectric materials such as silicon dioxide, organosilicates, and carbon doped silicon oxides. Further, the substrate can include any other materials such as metal nitrides and metal alloys, depending on the application.

Moreover, the substrate is not limited to any particular size or shape. The substrate can be a round wafer having a 200 mm diameter, a 300 mm diameter or other diameters, such as 450 mm, among others. The substrate can also be any polygonal, square, rectangular, curved or otherwise non-circular workpiece, such as a polygonal glass substrate used in the fabrication of flat panel displays.

FIG. 1 depicts a processing chamber 100 that may be used for vapor deposition processes as described herein. The processing chamber 100 may be used to perform CVD, plasma enhanced-CVD (PE-CVD), pulsed-CVD, ALD, PE-ALD, derivatives thereof, or combinations thereof. The processing chamber 100 includes a chamber body 102 and a lid assembly 104.

In one implementation, a remote plasma source 108 may be coupled to the processing chamber 100 through a gas port 110 to supply reactive plasma from the remote plasma source 108 to a substrate 112 disposed within the processing chamber 100. It is noted that the remote plasma source 108 may be coupled to the processing chamber 100 in any suitable position to supply a reactive remote plasma source to the substrate 112 surface as needed. Suitable gases that may be supplied to the remote plasma source 108 to be dissociated and further delivered to the substrate 112 surface include hydrogen, argon, helium, nitrogen, ammonia, combinations thereof and the like.

In FIG. 1, a control unit 114 may be coupled to the processing chamber 100 to control processing conditions. The control unit 114 comprises a central processing unit (CPU) 116, support circuitry 118, and memory 120 containing associated control software 122. The control unit 114 may be one of any form of a general purpose computer processor that can be used in an industrial setting for controlling various chambers and sub-processors. The CPU 116 may use any suitable memory 120, such as random access memory, read only memory, floppy disk drive, compact disc drive, hard disk, or any other form of digital storage, local or remote. Various support circuits may be coupled to the CPU 116 for supporting the processing chamber 100. The control unit 114 may be coupled to another controller that is located adjacent individual chamber components. Bi-directional communications between the control unit 114 and various other components of the processing chamber 100 are handled through numerous signal cables collectively referred to as signal buses, some of which are illustrated in FIG. 1.

Figure 2:
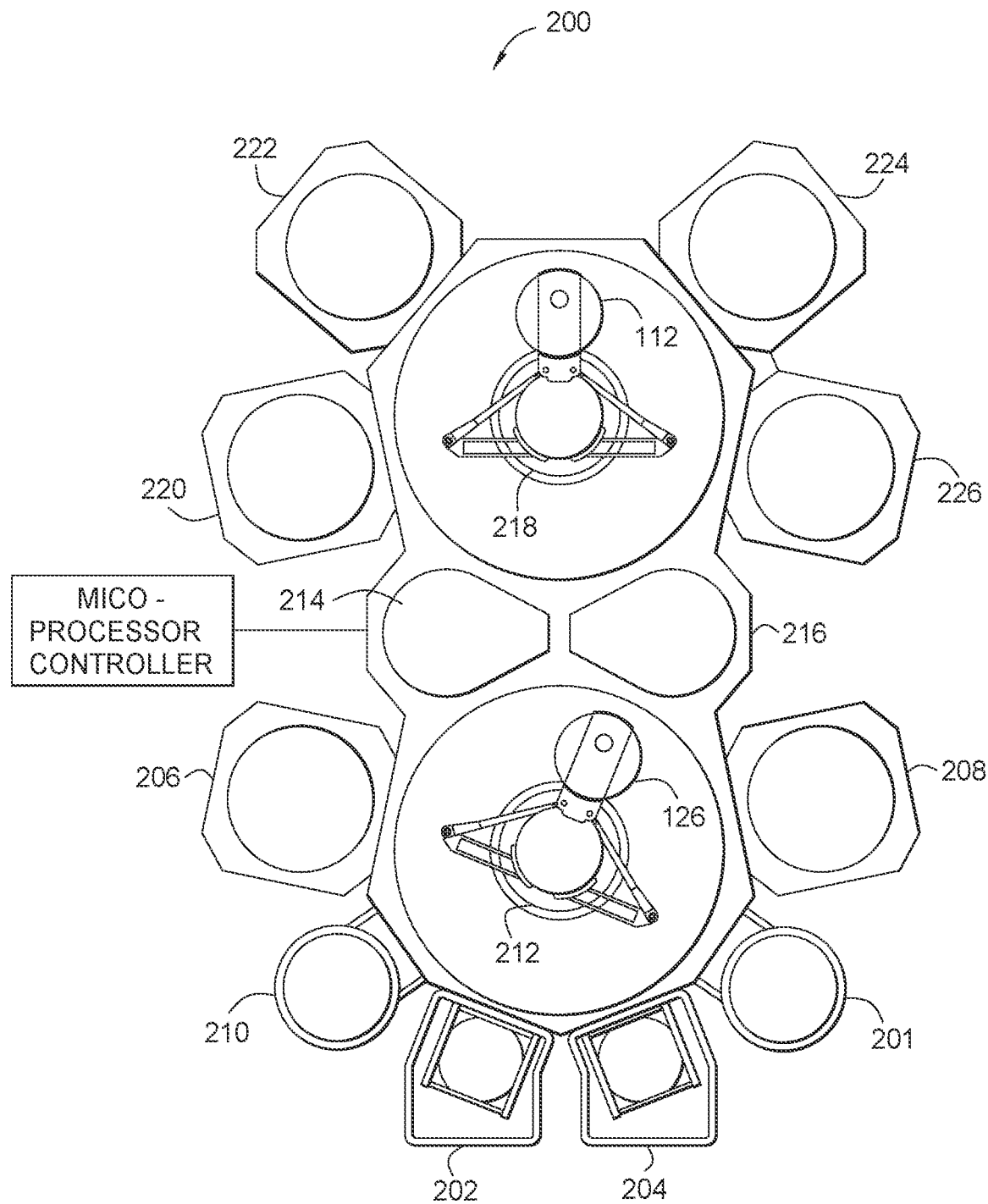
FIG. 2 is a schematic top-view diagram of a multi-chamber processing system according to one embodiment.

FIG. 2 is a schematic top view diagram of a multi-chamber processing system 200 having a first set of one or more processing chambers 201, 206, 208, 210. Any of the processing chambers 201, 206, 208, 210 may be configured as the processing chamber 100 as described above in reference to FIG. 1 to perform the operations disclosed herein. The system 200 may include one or more load lock chambers 202 and 204 for transferring the substrate 112 into and out of the system 200. Generally, the system 200 is maintained under vacuum and the load lock chambers 202 and 204 can be "pumped down" to introduce the substrate 112 into the system 200. A first robot 212 can transfer the substrate 112 between the load lock chambers 202 and 204, and a first set of one or more processing chambers 201, 206, 208, and 210. Each processing chamber 206, 208, 210, and 100 is configured to perform at least one substrate deposition process, such as cyclical layer deposition (CLD), atomic layer deposition (ALD), chemical vapor deposition (CVD), physical vapor deposition (PVD), etch, degas, pre-cleaning orientation, anneal, and other substrate processes.

The first robot 212 can also transfer the substrate 112 to/from one or more transfer chambers 214 and 216. The transfer chambers 214 and 216 can be used to maintain ultrahigh vacuum conditions while transferring the substrate 112 within the system 200. A second robot 218 can transfer the substrate 112 between the transfer chambers 214 and 216 and a second set of one or more processing chambers 220, 222, 224 and 226. Similar to the processing chambers 206, 208, 210, and 100, the processing chambers 220, 222, 224, and 226 can be outfitted to perform a variety of substrate processing operations including cyclical layer deposition (CLD), atomic layer deposition (ALD), chemical vapor deposition (CVD), physical vapor deposition (PVD), etch, pre-clean, degas, and orientation, for example. Any of the processing chambers 206, 208, 210, 220, 222, 224, and 226 can be removed from the system 200 if not necessary for a particular process to be performed by the system 200.

Figure 3:
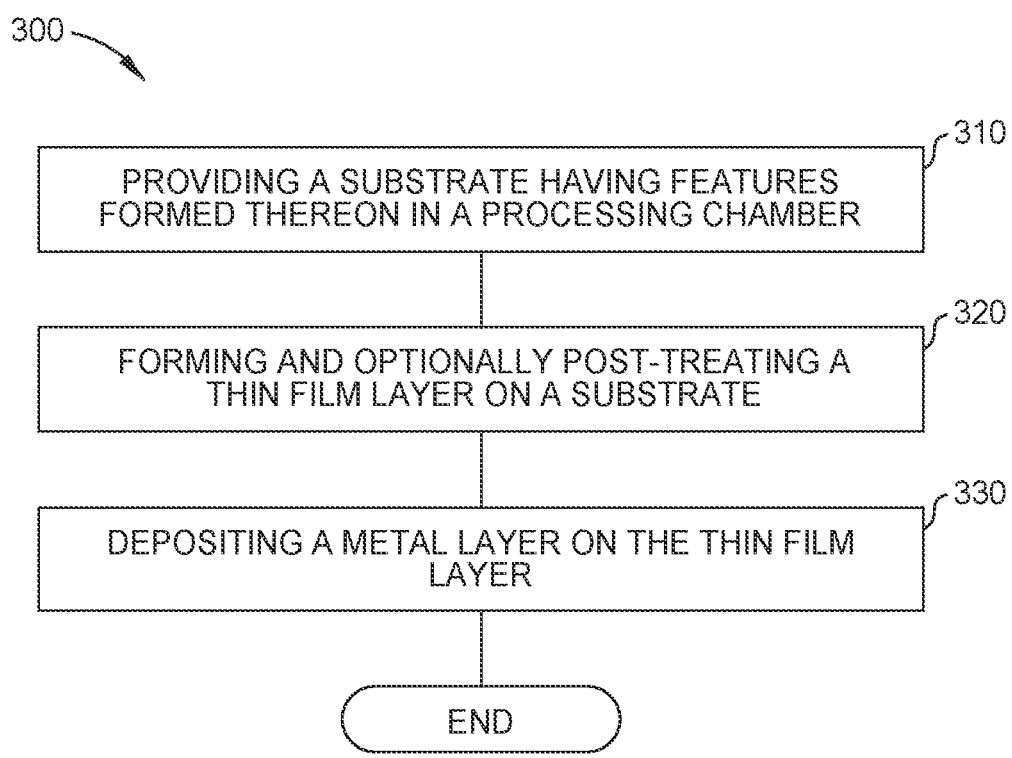
FIG. 3 depicts a flow diagram for a processing sequence used to fabricate a device structure on a substrate according to one embodiment.
Figure 4A:
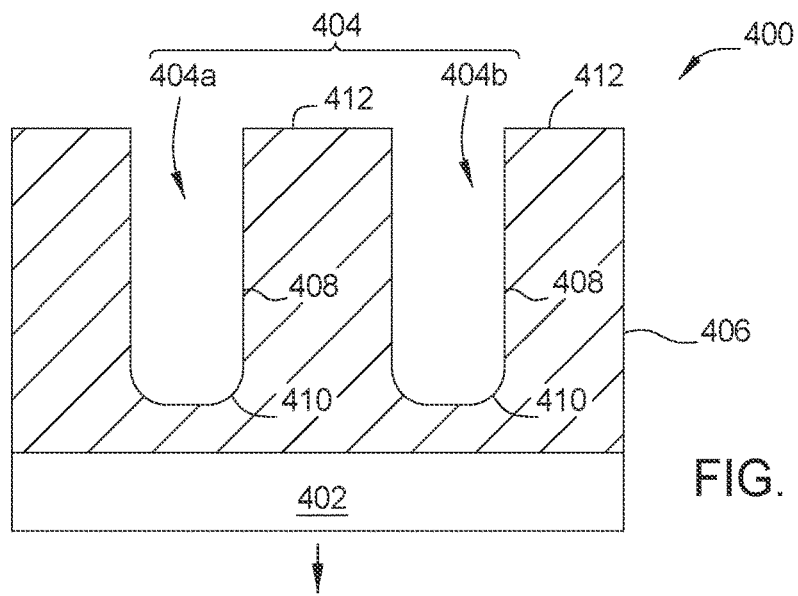
FIGS. 4A, 4B, and 4C are schematic cross-sectional views of a device structure at different stages of the processing sequences depicted in FIG. 3.
Figure 4B:
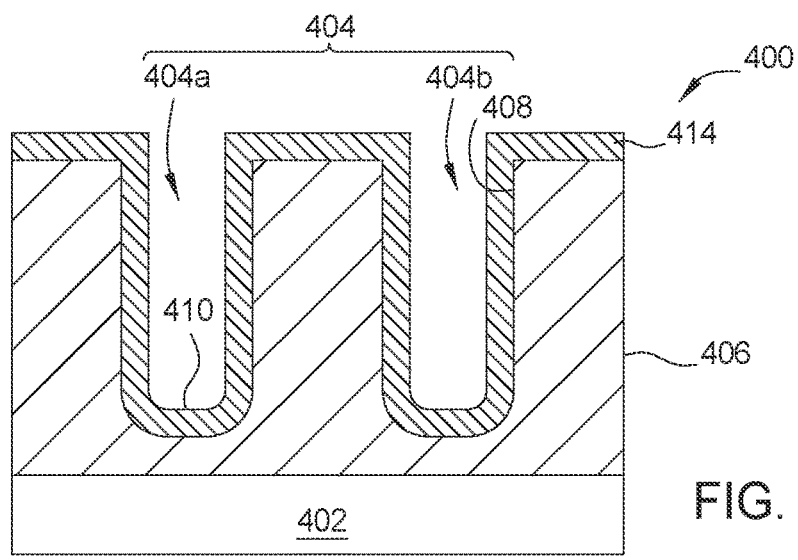
Figure 4C:
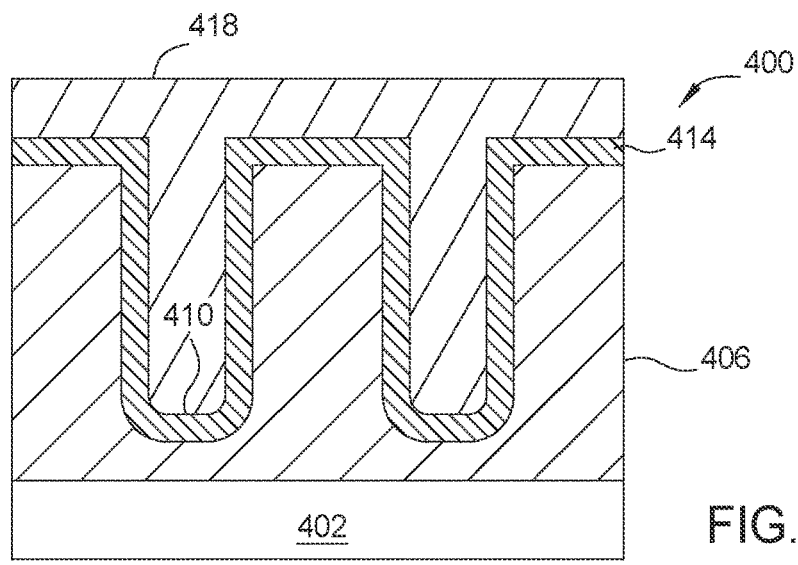

FIG. 3 depicts a flow diagram of a processing sequence 300 used to fabricate a device structure 400 on a substrate. FIGS. 4A-4C are schematic cross-sectional views of a device structure 400 formed on a substrate 402 during different stages of the processing sequence 300.

In block 310 of the processing sequence 300, a substrate 402 having features 404a, 404b formed thereon is provided into a processing chamber, such as the processing chamber 100 depicted in FIG. 1, or other suitable processing chamber. The features 404a, 404b (referred to collectively as 404 hereinafter) are formed within a layer 406 on the substrate 402, as depicted in FIG. 4A. It is noted that this particular device structure 400 may be used in three-dimensional (3-D) flash memory applications, DRAM applications, or other suitable applications with high aspect ratio or other odd geometries. The aspect ratios may be greater than 10:1, for example, greater than about 20:1.

The features 404a, 404b each have sidewalls 408 and a bottom surface 410. The sidewalls 408 and the bottom surface 410 form an open channel to expose the underlying layer 406. The layer 406 may be a single silicon containing layer, a high-k dielectric layer, a low-k dielectric layer, or a multiple-layer film stack. A single silicon containing layer may be a silicon oxide layer, a silicon nitride layer, a silicon oxynitride layer, a poly-silicon layer, a microcrystalline silicon layer, or a monocrystalline silicon layer. A dielectric layer may be a silicon oxide layer, a silicon nitride layer, or a combination thereof. A multiple-layer film stack may include alternating silicon containing oxide layers and silicon containing nitride layers. A multiple-layer film stack may include alternating silicon containing layers and dielectric layers. The layer 406 may be doped with p-type dopants, such as boron (B), or n-type dopants, such as phosphorous (P).

In block 320 of the processing sequence 300, a thin film layer 414 is formed on the exposed surfaces of the features 404 (i.e., the top surface 412 of the layer 406, sidewalls 408, and bottom surfaces 410 of the features 404a, 404b), as depicted in FIG. 4B. The thin film layer 414 is formed using a processing sequence 500 by non-plasma atomic layer deposition (ALD) and plasma post-treatment described in FIG. 5 or a processing sequence 600 plasma-enhanced ALD (PE-ALD) described in FIG. 6. The thin film layer 414 generally prevents diffusion of an adjacent conductive layer to the substrate 402, which may be a silicon or silicon germanium compound. The thin film layer 414 may include a metal or a metal nitride material, such as titanium (Ti), titanium nitride (TiN), tantalum (Ta), tantalum nitride (TaN), or combinations thereof. The thin film layer 414 may have a thickness between about 5 Å and about 100 Å.

In block 340 of the processing sequence 300, a metal layer 416 is deposited on the thin film layer 414, as depicted in FIG. 4C. A metal layer 416 is deposited within a processing chamber, such as a plasma enhanced chemical vapor deposition process chamber (PE-CVD) or a plasma enhanced atomic layer deposition process (PE-ALD) chamber. The metal layer 416 may be formed of tungsten (W), cobalt (Co), titanium (Ti), nickel (Ni), alloys thereof, or any combination thereof.

Figure 5:
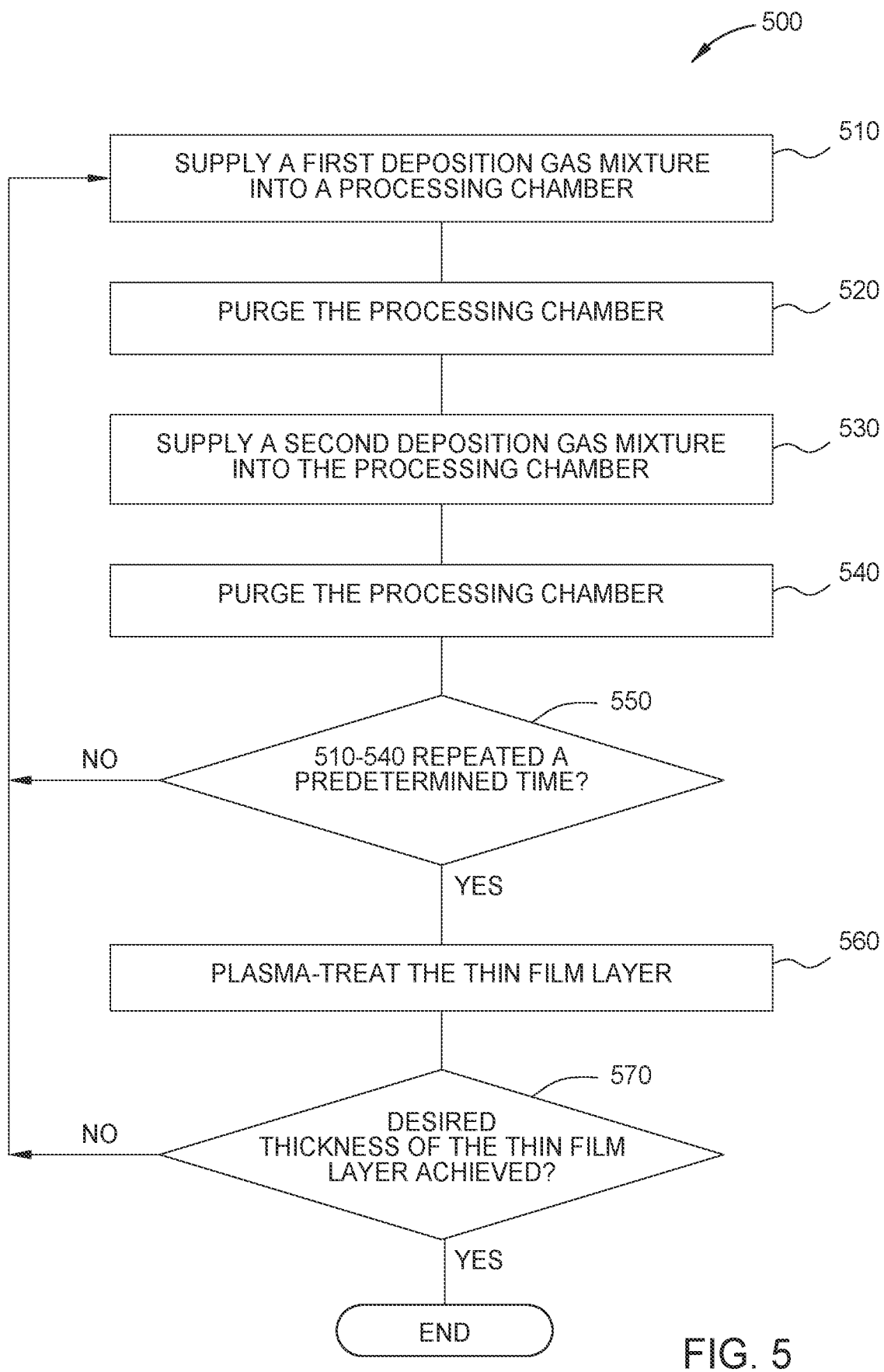
FIG. 5 depicts a flow diagram for a processing sequence used to deposit a thin film layer over an exposed surface of a substrate according to one embodiment.

FIG. 5 depicts a flow diagram for a processing sequence 500 used to deposit the thin film layer 414 over exposed surface of any suitable substrates, such as the exposed surfaces of the features 404 as described in block 320 of the processing sequence 300, according to one embodiment. The thin film layer 414 may be a titanium nitride (TiN) layer or tantalum nitride (TaN) layer. The processing sequence 500 includes a non-plasma ALD process (blocks 510-550) for depositing the thin film layer 414 over an exposed surface of a substrate and a plasma treatment process (block 560) for post-treating the deposited thin film layer 414.

In block 510 of the processing sequence 500, a first deposition process is performed. The first deposition process includes pulsing a first deposition gas mixture, including titanium containing precursor, such as titanium tetrachloride (TiCl$_4$), or tantalum containing precursor, such as pentakis (dimethylamino)tantalum(V) (C$_{10}$H$_{30}$N$_5$Ta), tantalum pentachloride (TaCl$_5$), and tantalum pentafluoride (TaF$_5$), into an ALD chamber. The ALD chamber may be one of the processing chambers 206, 208, 210, 220, 222, 224, 226 of the system 200 that is configured as the processing chamber 100 depicted in FIG. 1. The metal source material (i.e., titanium (Ti) or tantalum (Ta)) absorbs on reactive sites on an exposed surface of a substrate, forming no more than about one monolayer of the metal source material on the exposed surface of the substrate. Once the metal source material absorbs on all those reactive sites, reaction of the metal source material with the exposed surfaces of the exposed surface of the substrate stops.

In some embodiments, the first deposition gas mixture is supplied into the ALD chamber simultaneously with, sequentially with, or alternatively without a reducing gas mixture (reagent), such as a hydrogen gas (H$_2$). In one implementation, a pulse of the first deposition gas mixture and a pulse of a reducing gas mixture may be sequentially and repetitively supplied into the ALD chamber. In another implementation, the reducing gas mixture is continuously flowed, while a pulse of the first deposition gas mixture and a pulse of a reducing gas mixture are repetitively supplied into the ALD deposition processing chamber. The first deposition gas mixture may also include a purge gas mixture supplied concurrently into the ALD chamber.

The term "pulse" as used herein refers to a dose of a deposition gas mixture injected into a processing chamber. The pulse of the deposition gas mixture continues for a predetermined time interval. The time interval for the pulse of the deposition gas mixture is variable depending on a number of factors such as, desired film thickness, a volume of the processing chamber, throughput requirement, a rate of gas flow, and the like.

During pulsing of the first deposition gas mixture, several process parameters are also regulated. In one implementation, the process pressure is controlled at between about 0.1 Torr and about 50 Torr. The processing temperature is between about 200 degrees Celsius and about 600 degrees Celsius, for example, about 450 degrees Celsius.

In block 520 of the processing sequence 500, following the first deposition process, a first purging process is performed. The first purging process includes supplying a purge gas mixture into the ALD chamber to remove any excess metal source material and reaction byproducts from the ALD chamber. In one implementation, the purge gas mixture includes at least a hydrogen containing gas and an inert gas. Suitable examples of the hydrogen containing gas may include H$_2$, H$_2$O, H$_2$O$_2$ or the like. Suitable examples of the inert gas include Ar, He, or Kr.

During pulsing of the purge gas mixture, the process pressure may be pumped down to a certain low level, such as lower than 2 Torr, for example, lower than 0.5 Torr, at a relatively short time interval, such as between about 1 second and about 5 seconds, so as to assist rapidly pumping out excess metal source material and reaction byproducts from the ALD chamber. In one implementation, the process pressure is controlled at between about 0.1 Torr and about 50 Torr. The processing temperature is between about 200 degrees Celsius and about 600 degrees Celsius, for example, about 450 degrees Celsius. The Ar gas may be supplied at between about 200 sccm and about 5000 sccm.

In block 530 of the processing sequence 500, a second deposition process is performed. The second deposition process includes pulsing a second deposition gas mixture, including a nitrogen source compound, such as ammonia (NH$_3$) and nitrogen (N$_2$), into the ALD chamber. The nitrogen source compound reacts with the monolayer formed by the metal source material in block 510. Once the nitrogen source compound absorbs on all reactive sites of the monolayer, reaction of the nitrogen source compound with the monolayer stops and no more than about one monolayer of the thin film layer 414 is formed.

Similar to the process step of supplying the first deposition gas mixture in block 510, the second deposition gas mixture is supplied into the ALD chamber simultaneously with, sequentially with, or alternatively without a reducing gas mixture (reagent), such as a hydrogen gas ($H_2$). In one implementation, a pulse of the first deposition gas mixture and a pulse of a reducing gas mixture may be sequentially and repetitively supplied into the ALD chamber. In another implementation, the reducing gas mixture is continuously flowed, while a pulse of the first deposition gas mixture and a pulse of a reducing gas mixture are repetitively supplied into the ALD deposition processing chamber. The first deposition gas mixture may also include a purge gas mixture supplied concurrently into the ALD chamber.

During pulsing of the second deposition gas mixture, several process parameters are also regulated. In one implementation, the process pressure is controlled at between about 0.1 Torr and about 50 Torr. The processing temperature is between about 200 degrees Celsius and about 600 degrees Celsius, for example, about 450 degrees Celsius.

In block 540 of the processing sequence 500, following the second deposition process, a second purging process is performed. The second purging process includes supplying a purge gas mixture into the ALD chamber to remove any excess nitrogen source compound and reaction byproducts from the ALD chamber. The second purging process in block 540 is substantially similar to the first purging process in block 520 and detailed descriptions of the second purging process in block 540 are omitted.

In block 550 of the processing sequence 500, if the process steps 510-540 of forming monolayers of the thin film layer 414 have been repeated a predetermined number of times, the process sequence 500 proceeds to post-treatment step in block 560. If the process steps 510-540 of forming monolayers of the thin film layer 414 have not been repeated the predetermined number of times, the process sequence 500 returns to block 510 to repeat the process steps 510-540. In some embodiments, the process steps 510-540 are repeated between about 2 times and about 2,000 times, for example, 30 times. The number of repetitions is determined by deposition rate, post-treatment penetration depth, and integration needs for application.

In block 560 of the processing sequence 500, a plasma treatment process is performed. The plasma treatment process includes exposing the thin film layer 414 to a plasma by using an microwave plasma source. In some embodiments, the plasma treatment process lasts for between about 5 seconds and about 10 minutes, for example, for about 30 seconds.

Exemplary plasma forming gases for the plasma treatment process of block 560 include nitrogen ($N_2$), ammonia ($NH_3$), hydrogen ($H_2$), and combinations thereof. During the plasma treatment process, several process parameters are also regulated. In one implementation, the process pressure is controlled at between about 7 Torr and about 30 Torr. The processing temperature is between about 200 degrees Celsius and about 600 degrees Celsius, for example, about 450 degrees Celsius. The RF power may be controlled at between about 100 Watts and about 5,000 Watts, for example, about 400 Watts. The plasma forming gas, such as nitrogen ($N_2$), ammonia ($NH_3$), may be supplied at between about 50 sccm and about 5000 sccm.

In block 570 of the processing sequence 500, if a desired thickness of the plasma treated thin film layer 414 has not been achieved, the processing sequence 500 returns to the process steps 510-560 for depositing and plasma-treating monolayers of the thin film layer 414. In some embodiments, a desired thickness of the thin film layer 414 is between about 10 Å and about 100 Å, for example, 70 Å about and the process steps 510-560 are repeated between 2 times and 20 times, for example 6 times It has been shown by the inventors of the disclosure that a plasma treatment after deposition steps reduces the stress of the as-deposited layer. Table 1 summarizes data taken from titanium nitride (TiN) films deposited by 180 repetitions of the non-plasma ALD process (blocks 510-540) (a) with no plasma treatment (block 560), (b) with plasma treatment (block 560) with ammonia ($NH_3$) and argon (Ar), and (c) with plasma treatment (block 560) with nitrogen ($N_2$) and argon (Ar). As can be seen, the average thickness and the resistivity of a TiN film are increased, and the stress in the TiN film is reduced by the plasma treatment as compared to a TiN film without plasma treatment. Content ratio of titanium (Ti) to nitrogen (N) and crystal structure in TiN films are also altered to contain more nitrogen and contain more grains having (111) crystal orientation by the plasma treatment. Furthermore, the increase in the resistivity, and the reduction in stress, content ratio of titanium (Ti), ratio of grains having (111) crystal orientation to grains having (200) crystal orientation in a TiN film are greater when a TiN film is treated with (c) $N_2$/Ar than with (b) $NH_3$/Ar.

TABLE 1

|  | (a) No plasma treatment | (b) Plasma treatment $NH_3$/Ar | (c) Plasma treatment $N_2$/Ar |
|---|---|---|---|
| Average Thickness (Å) | 67.13 | 66.95 | 68.49 |
| Resistivity (µOhm · cm) | 333.47 | 356.24 | 412.49 |
| Stress (Mpa) | 300 | 300 | 100 |
| Ti/N Ratio | 0.2 | 0.14 | 0.07 |

Thus, film properties, such as resistivity, stress, film composition (i.e., content ratio of metal source material), and crystal structure, may be modified from as-deposit films by plasma post-treatment, and further tuned by using different plasma forming gases (e.g., nitrogen ($N_2$) versus ammonia ($NH_3$)) or ratio of different plasma forming gases.

Figure 6:
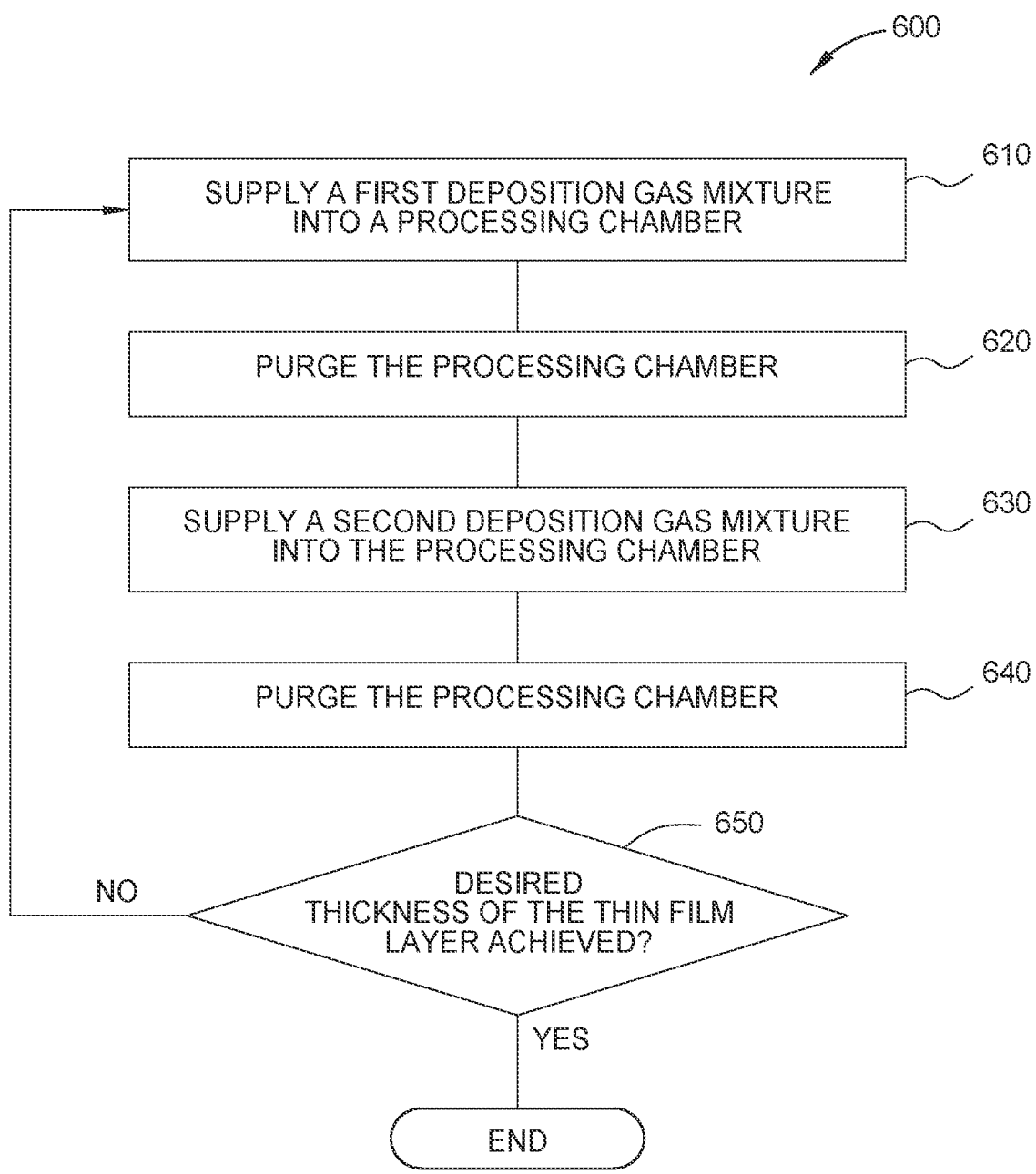
FIG. 6 depicts a flow diagram for a processing sequence used to deposit a thin film layer over an exposed surface of a substrate according to one embodiment.

FIG. 6 depicts a flow diagram for a processing sequence 600 used to deposit a thin film layer 414 over exposed surface of any suitable substrates, such as the exposed surfaces of the features 404 as described in block 320 of the processing sequence 300 according to one embodiment. The thin film layer 414 may be a titanium nitride (TiN) layer or tantalum nitride (TaN). The processing sequence 600 includes plasma-enhanced ALD (PE-ALD) process (blocks 610-650) for depositing the thin film layer 414 over an exposed surface of a substrate.

In block 610 of the processing sequence 600, a first deposition process is performed. The first deposition process includes pulsing a first deposition gas mixture, including titanium containing precursor, such as titanium tetrachloride ($TiCl_4$), or tantalum containing precursor, such as pentakis (dimethylamino)tantalum(V) ($C_{10}H_{30}N_5Ta$), tantalum pentachloride ($TaCl_5$), and tantalum pentafluoride ($TaF_5$), into an ALD chamber. The ALD chamber may be one of the processing chambers 206, 208, 210, 220, 222, 224, 226 of the system 200 that is configured as the processing chamber 100 depicted in FIG. 1. The metal source material (i.e., titanium (Ti) or tantalum (Ta)) absorbs on reactive sites on an exposed surface of a substrate, forming no more than about one monolayer of the metal source material on the exposed surface of the substrate. Once the metal source material absorbs on all those reactive sites, reaction of the metal source material with the exposed surfaces of the exposed surface of the substrate stops.

In some embodiments, the first deposition gas mixture is supplied into the ALD chamber simultaneously with, sequentially with, or alternatively without a reducing gas mixture (reagent), such as a hydrogen gas ($H_2$). In one implementation, a pulse of the first deposition gas mixture and a pulse of a reducing gas mixture may be sequentially and repetitively supplied into the ALD chamber. In another implementation, the reducing gas mixture is continuously flowed, while a pulse of the first deposition gas mixture and a pulse of a reducing gas mixture are repetitively supplied into the ALD deposition processing chamber. The first deposition gas mixture may also include a purge gas mixture supplied concurrently into the ALD chamber.

During pulsing of the first deposition gas mixture, several process parameters are also regulated. In one implementation, the process pressure is controlled at between about 0.1 Torr and about 50 Torr. The processing temperature is between about 200 degrees Celsius and about 600 degrees Celsius, for example, about 450 degrees Celsius.

In block 620 of the processing sequence 600, following the first deposition process, a first purging process is performed. The first purging process includes supplying a purge gas mixture into the ALD chamber to remove any excess metal source material and reaction byproducts, if any, from the ALD chamber. In one implementation, the purge gas mixture includes at least a hydrogen containing gas and an inert gas. Suitable examples of the hydrogen containing gas may include $H_2$, $H_2O$, $H_2O_2$ or the like. Suitable examples of the inert gas include Ar, He, or Kr.

During pulsing of the purge gas mixture, the process pressure may be pumped down to a certain low level, such as lower than 2 Torr, for example, lower than 0.5 Torr, at a relatively short time interval, such as between about 1 second and about 6 seconds, so as to assist rapidly pumping out excess metal source material and reaction byproducts from the ALD chamber. In one implementation, the process pressure is controlled at between about 0.1 Torr and about 2 Torr, such as 0.1 Torr and about 1 Torr, for example between about 0.1 Torr and about 0.6 Torr. The processing temperature is between about 200 degrees Celsius and about 600 degrees Celsius, for example, about 450 degrees Celsius. The Ar gas may be supplied at between about 200 sccm and about 5000 sccm.

In block 630 of the processing sequence 600, a second deposition process is performed. The second deposition process includes supplying a plasma reactant, including nitrogen radicals (N*) into the ALD chamber from a remote plasma source, such as the remote plasma source 108 of the processing chamber 100 depicted in FIG. 1. In some embodiments, the plasma reactant is a plasma-excited species of nitrogen (e.g., N*) or hydrogen (e.g., H*), or a hydrogen-nitrogen plasma (e.g., NH*, $NH_2$*, $NH_3$). Plasma-excited species may be from hydrogen ($H_2$), nitrogen ($N_2$), ammonia ($NH_3$), and combinations thereof. Nitrogen radicals react with the monolayer formed by the metal source material in block 610 and forms no more than about one monolayer of the thin film layer 414.

During the supplying of a plasma reactant in block 630, several process parameters may be regulated to control the pretreatment process. In one exemplary implementation, a process pressure in the processing chamber is regulated between about 50 mTorr to about 5000 mTorr, such as between about 500 mTorr and about 1000 mTorr, for example, at about 700 mTorr. For example, a power of about 1000 Watts to about 6000 Watts may be applied to maintain a plasma inside the processing chamber. A temperature in the processing chamber is maintained between room temperature to about 600 degrees Celsius, for example, room temperature, or about 310 degrees Celsius. In one implementation, the plasma reactant is supplied for between about 10 seconds and about 300 seconds, depending on the operating temperature, pressure, and flow rate of the gas. For example, the substrate 402 can be exposed for about 30 seconds to about 60 seconds.

In block 640 of the processing sequence 600, following the supplying of a plasma reactant, a second purging process is performed. The second purging process includes supplying a purge gas mixture into the ALD chamber to remove any excess nitrogen source and reaction byproducts from the ALD chamber. The second process in block 640 is substantially similar to the first purging process in block 620 and detailed descriptions of the purging in block 640 are omitted.

In block 650 of the processing sequence 600, if a desired thickness of the thin film layer 414 has not been achieved, the processing sequence 600 returns to the process steps 610-640 for forming monolayers of the thin film layer 414. In some embodiments, a desired thickness of the thin film layer 414 is between about 10 Å and about 100 Å, for example, 25 Å about and the process steps 610-640 are repeated between 10 times and 500 times.

It has been shown by the inventors of the disclosure that a titanium nitride (TiN) deposited by a plasma-enhanced ALD (PE-ALD) process using a plasma reactant N* from a remote plasma source has ratio of grains having (200) crystal orientation to grains having (111) crystal orientation of 1.34 as compared with similar nitride films deposited by a non-plasma ALD process that has the ratio of 2.8. Thus, the use of a remote plasma source in a PE-ALD process may alter crystal structures within metal nitride films. Further, Table 2 summarizes data taken from TaN films formed by a non-plasma ALD process and plasma enhanced ALD process with various plasma reactants and various plasma exposure times at various exposure temperatures. As can be seen, content ratio of tantalum (Ta) to nitrogen (N) in TaN films increases as the exposure time and the exposure temperature increase.

TABLE 2

| Plasma reactants | Exposure temperature (° C.) | Exposure time (seconds) | Ta/N Ratio |
|---|---|---|---|
| No plasma reactants | N/A | N/A | 1.05 |
| N* + H* | 310 | 10 | 1.15 |
| N* | 310 | 10 | 1.13 |
| Ar* | 310 | 10 | 1.19 |
| Ar* | Room temperature | 60 | 1.20 |
| N* | Room temperature | 60 | 1.34 |
| N* | Room temperature | 180 | 1.39 |
| N* | Room temperature | 300 | 1.56 |
| N* | Room temperature | 600 | 1.81 |
| N* | 310 | 60 | 1.20 |
| N* | 310 | 180 | 1.50 |
| N* | 310 | 300 | 1.91 |
| N* | 310 | 600 | 2.84 |

Thus, film properties, such as crystal structure and film composition, may be modified by the use of plasma reactants form a remote plasma source. Metal nitrides films, such as a titanium nitride (TiN), have varying work functions on surfaces of different crystal orientations. Due to this variation and tunablity of the crystal structure of metal nitride films by plasma treatment, metal nitride layers formed according to the implementation described herein may be used as a work function material.

In the embodiments described above, methods for forming metal nitride films are provided. In one implementation, the methods include depositing metal nitride films by a non-plasma ALD process and post-treating as-deposited nitride films using a microwave plasma source. In another implementation, the methods include depositing metal nitride films by a plasma-enhanced ALD process using a remote plasma source. In both implementations, film properties, such as film composition, crystal structure, film density, resistivity, may be altered by the use of plasma, as compared with similar metal nitride films deposited by a non-plasma ALD process. Furthermore, film properties may be tuned by varying temperatures and pressure a processing chamber during a plasma treatment, and content ratio of nitrogen, ammonia, and argon in plasma.

While the foregoing is directed to implementations of the present disclosure, other and further implementations of the disclosure may be devised without departing from the basic scope thereof, and the scope thereof is determined by the claims that follow.

The invention claimed is:

1. A method for forming a metal nitride layer on a substrate, comprising:
performing a first deposition process comprising exposing a substrate to a first deposition gas mixture including metal source material in a processing chamber to deposit metal source material on an exposed surface of the substrate;
performing a first purging process comprising supplying a first purge gas mixture into the processing chamber to remove excess metal source material and reaction byproducts from the processing chamber;
performing a second deposition process comprising exposing the substrate to a plasma reactant including nitrogen radicals in the processing chamber for an exposure time of between 60 seconds and 600 seconds to form a metal nitride layer having content ratio of the metal source material to nitride of between 1.34 and 2.84; and
performing a second purging process comprising supplying a second purge gas mixture into the processing chamber to remove excess nitride source compound and reaction byproducts from the processing chamber,
wherein the first deposition process, the first purging process, the second deposition process, and the second purging process are repeated until the metal nitride layer having a thickness of between 10 Å and 100 Å is achieved,
wherein the first deposition gas mixture comprises titanium tetrachloride ($TiCl_4$) and the metal source material comprises titanium (Ti), and
wherein the first deposition process and the first and second purging processes are performed at a temperature between 200 degrees Celsius and 600 degrees Celsius.

2. The method of claim 1, wherein the first deposition process comprises an atomic layer deposition process.

3. The method of claim 1, wherein the first deposition gas mixture comprises a tantalum containing precursor selected from the group consisting of pentakis (dimethylamino) tantalum (V) ($C_{10}H_{30}N_5Ta$), tantalum pentachloride ($TaCl_5$), and tantalum pentafluoride ($TaF_5$) and the metal source material comprises tantalum (Ta).

4. The method of claim 1, wherein the first and second purge gas mixtures comprise hydrogen containing gas and inert gas.

5. The method of claim 1, wherein the plasma reactant comprises a plasma-excited species of nitrogen or hydrogen, or a hydrogen-nitrogen plasma.

6. The method of claim 1, wherein the second deposition process is performed at a temperature between 200 degrees Celsius and 600 degrees Celsius.

7. The method of claim 1, wherein the first purging process and the second purging process are performed at a pressure lower than 2 Torr.

* * * * *